(12) United States Patent
Lecomte et al.

(10) Patent No.: US 9,938,617 B2
(45) Date of Patent: Apr. 10, 2018

(54) MODULAR COATER SEPARATION

(75) Inventors: Benoit Lecomte, Jumet (BE); Hugues Wiame, Jumet (BE); Tomohiro Yonemichi, Yokohama (JP)

(73) Assignee: AGC Glass Europe, Bruxelles (BE)

( * ) Notice: Subject to any disclaimer, the term of this patent is extended or adjusted under 35 U.S.C. 154(b) by 742 days.

(21) Appl. No.: 13/880,908

(22) PCT Filed: Oct. 18, 2011

(86) PCT No.: PCT/EP2011/068176
§ 371 (c)(1),
(2), (4) Date: Apr. 22, 2013

(87) PCT Pub. No.: WO2012/052428
PCT Pub. Date: Apr. 26, 2012

(65) Prior Publication Data
US 2013/0337193 A1    Dec. 19, 2013

(30) Foreign Application Priority Data
Oct. 22, 2010   (EP) .................... 10188560

(51) Int. Cl.
*C23C 14/34*   (2006.01)
*C03C 17/00*   (2006.01)
(Continued)

(52) U.S. Cl.
CPC ............ *C23C 14/34* (2013.01); *C03C 17/002* (2013.01); *C23C 14/564* (2013.01);
(Continued)

(58) Field of Classification Search
CPC . C23C 14/568; C23C 14/45519; C23C 16/54; C23C 14/0078; C23C 14/00–14/5893
(Continued)

(56) References Cited

U.S. PATENT DOCUMENTS 5,420,044 A    5/1995  Kozuka
6,187,101 B1 *  2/2001  Yoshizawa .................... 118/718
(Continued)

FOREIGN PATENT DOCUMENTS

DE    10 2008 019 427    10/2009
DE    10 2009 029 902    9/2010
(Continued)

OTHER PUBLICATIONS

Machine translation of DE 10 2008 019 427.*
(Continued)

*Primary Examiner* — Elizabeth A Burkhart
(74) *Attorney, Agent, or Firm* — Oblon, McClelland, Maier & Neustadt, L.L.P.

(57) ABSTRACT

The invention relates to a process for depositing under vacuum a multilayers coating stack on a flat glass substrate and to a modular coater for the deposit of thin layers on a flat glass substrate. A gas separation zone disposed between two depositing zones of the modular coater comprises at least one gas injector in the vicinity of the convoying path for the glass substrate which passes through apertures from a depositing zone towards the other depositing zone via the separation zone. The invention allows improvement of the separation factor between the two depositing zones.

19 Claims, 1 Drawing Sheet

Figure 1:
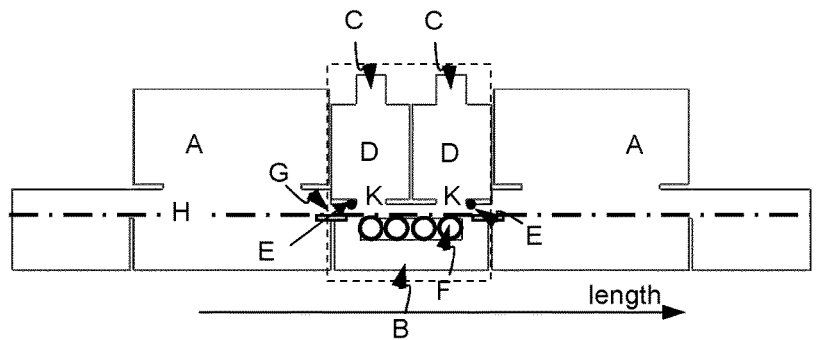

A – depositing zone        E – gas injection        K – slit
B – separation chamber     F – conveyor (optional)
C – pumps                  G – aperture
D – compartment            H – convoying path

(51) Int. Cl.
*C23C 14/56* (2006.01)
*C23C 16/54* (2006.01)
*C23C 16/48* (2006.01)

(52) U.S. Cl.
CPC ............ *C23C 14/568* (2013.01); *C23C 16/48* (2013.01); *C23C 16/54* (2013.01)

(58) Field of Classification Search
USPC ...................................................... 427/255.5
See application file for complete search history.

(56) References Cited

U.S. PATENT DOCUMENTS

| | | | | |
|---|---|---|---|---|
| 6,358,377 | B1* | 3/2002 | Schloremberg | ....... C03C 17/002 118/719 |
| 2009/0142165 | A1* | 6/2009 | Krause | .................. C23C 14/566 414/217 |
| 2009/0324379 | A1 | 12/2009 | He et al. | |
| 2009/0325367 | A1 | 12/2009 | He et al. | |
| 2010/0206229 | A1 | 8/2010 | He et al. | |
| 2010/0224481 | A1* | 9/2010 | Greene | ............... C23C 14/0036 204/192.13 |
| 2011/0265725 | A1 | 11/2011 | Tsuji et al. | |

FOREIGN PATENT DOCUMENTS

| | | |
|---|---|---|
| JP | 62-202078 | 9/1987 |
| JP | 2001-23907 | 1/2001 |
| JP | 2010-77508 | 4/2010 |
| WO | 2005 106069 | 11/2005 |
| WO | WO 2005/106069 * | 11/2005 |
| WO | 2009 155119 | 12/2009 |
| WO | 2010 089460 | 8/2010 |
| WO | 2011-034751 | 3/2011 |
| WO | 2011-097012 | 8/2011 |

OTHER PUBLICATIONS

Machine translation of WO 2005/106069.*
International Search Report dated Jan. 5, 2012 in PCT/EP11/68176 Filed Oct. 18, 2011.

* cited by examiner

| | | |
|---|---|---|
| A – depositing zone | E – gas injection | K – slit |
| B – separation chamber | F – conveyor (optional) | |
| C – pumps | G – aperture | |
| D – compartment | H – convoying path | |

| | | |
|---|---|---|
| A – depositing zone | E – gas injection | J – side aperture |
| B – separation chamber | F – conveyor (optional) | K – slit |
| C – pumps | G – aperture | |
| D – compartment | H – convoying path | |

MODULAR COATER SEPARATION

The present invention concerns a process for depositing under vacuum a multi-layers coating stack on a flat glass substrate and a coater apparatus for the deposit of multi-layer coating stacks under vacuum on large glass substrates, having for example 2 or 3 or 4 meters width, for example 3.21 meters, in an uninterrupted way. The glass substrates, or glass sheets, follow each other in the coater apparatus with a few cm to one another; so, there is a space between them. This apparatus is a cathodic sputtering apparatus or a PVD (Physical Vapour Deposition) coater and may be a magnetically enhanced sputtering apparatus, also called a magnetron. The apparatus may also be a PECVD (Plasma-Enhanced Chemical Vapour Deposition) coater for example.

The multi-layer coatings may comprise one or more, and in particular three or even four, silver infrared reflective layers surrounded by dielectric layers, such as metal oxide or metal nitride layers. The glass substrate coated with such multi-layer coating can serve to constitute solar control glazing panel or low emissivity glazing panel. The coated glass substrate can be assembled with another glass substrate to form an Insulating Glass Unit (IGU) or laminated with another glass substrate to form a vehicle transparency like a windshield for example.

The expression "under vacuum" means that the pressure within the deposition zones is reduced to a value significantly lower than the normal atmospheric pressure, for example to a pressure comprised between 0.1 and 99 mTorr ($10^{-3}$ Torr), preferably for example between 0.5 and 15 mTorr.

Each layer or group of similar layers (for example metal layers) of the coating corresponds to a sputtering zone, i.e. a depositing zone, which comprises one or more positions (a position is a source bay) for cathode (target) corresponding to the layer to be deposited and in which a particular atmosphere, containing argon alone or together with oxygen or nitrogen or another specific gas, is maintained in a reduced pressure. One module of a modular coater may generally comprise three (sometimes four) depositing zones associated with three pumping zones to maintain the required low level of pressure in the depositing zone. Due to higher complexity and the increasing number of layer of the new coating stacks, especially for coating having at least three infrared reflective layers (silver layer), the number of required depositing zone increases and the current apparatus become too small.

Also a higher flexibility of the coaters is required so that several coatings can be produced on the same line, for example heat treatable and not heat treatable coatings. This increases the number of positions required. The requirement is also to reduce the time length necessary to produce the coating.

On coaters that operate under vacuum, such as magnetron, gas isolation system between depositing zones (or chambers) (also called "coat zones") are necessary to separate different processes. For example, in the production of low emissivity single, double or triple silver coating on flat glass, the deposition of metallic silver that needs pure argon injection and the sputtering of a dielectric that requires the injection of oxygen ($O_2$) or nitrogen ($N_2$) flows are next to each other. Without a gas isolation zones, the partial pressure of the $O_2$ or $N_2$ in the metallic sputter chamber would be too high to obtain good metal properties for the Ag layer. This is why these two depositing zones are separated by a section often called gas separation zone, having preferably pumping means (also called in this case pumping section). The design of the isolation between depositing zones depends on the type of coaters. The two main suppliers of large area coaters for the glass industry are AMAT (ex: BOC) and Von Ardenne.

For the AMAT type modular coater, the isolation is provided by multiple pumped tunnels. The tunnel is conductance-limiting aperture joined to the chamber periphery. Three tunnels are provided in each gas separation zone. The aperture is adjustable to accommodate glass (substrate) of varied thickness. A pumping gap is formed between the apertures. Each gap is pumped by a dedicated 16" diffusion pump (DP). For a standard design a total of 6 DP are connected to the isolation section. In this case, additional stage of isolation for especially sensitive coatings can only be realized by adding a tunnel section with 2 DP on each side of the tunnel. The total length of the standard isolation section is about 2000 mm.

For the Von Ardenne type coater the gas separation zone is called the "pump section" in opposition to the "sputter section" where the process takes place. The width of the pump section is equivalent to process chamber and is equal to 780 mm. It is equipped with two isolation tunnels. One of the tunnels is a full metal plate placed at about 25 mm on top of the pass line; openings through the neighbour process chamber are present on the top side wall of the coater. The second tunnel is a metal plate with a slit in the centre along the width of the coater (perpendicular to the glass transfer direction), the pumping of the gas in that segment is done through the slit. Each of the two segments of the pump section are pumped with one to three Turbo Molecular Pumps (TMP). The pumps are fixed on the lid along two parallel lines.

The performance of the isolation section placed between two sputter chambers is called the isolation factor or gas separation factor (SF). It is measured by evacuating the sputter chamber to a pressure level below $10^{-5}$ mbar. Argon gas is fed into a depositing zone (zone 1) to a pressure level of $5 \times 10^{-3}$ mbar (filling pressure). At the depositing zone (zone 2) on the other side of the gas separation zone the pressure is measured (test pressure). The test is then repeated with Ar gas being fed into the zone 2, the pressure being measured in zone 1. The average gas separation factor (SF) shall be calculated as: 0.5 ((filling pressure zone 1/test pressure zone 2)+filling pressure zone 2/test pressure zone 1)). For this calculation no glass is present in the tunnel. Indeed, as there is a space between the substrates during the depositing process, there are regularly moments without glass substrate, so the separation must be effective without glass substrate and the separation factor must be evaluated without glass substrate.

On existing industrial lines, the separation factor has been measured. The values for an isolation zone for the AMAT modular coater design is between 25 and 50. The values for a single Von Ardenne type pump section is comprised between 30 and 200 depending on the number of pumps and the tunnel plate height. This factor increases to 400 when 2 pump sections are side by side.

In conclusions, one can notice that the separation zones are all based on the same principle; it is a long (between 780 and 2000 mm) zone between two depositing zones where the conductance is reduced by adjusting the pass line to tunnel (metal plate) distance. The zone is more or less open with apertures beside which pumping is installed. This can be defined as a quite static design.

Prior art coaters are designed with static gas isolation between depositing zones or sputter chambers. This configuration gives a minimal gas separation factor of 30 according to specifications, but actual values measured on coaters is around 400 in the best case.

The goal of the invention is to improve the gas separation between two depositing zones in a coater.

The invention relates to a process for depositing a multi-layers coating stack on a flat glass substrate comprising depositing under vacuum a least a first layer in a first depositing zone having a first atmosphere type and at least a second layer in a second depositing zone having a second atmosphere type which is separated from the first atmosphere type by a separation zone, wherein the flat glass substrate moves from the first depositing zone to the second depositing zone through the separation zone along a conveying path, characterised in that a gas is injected into the separation zone in the vicinity of the conveying path in order to increase the separation factor between the two atmosphere types.

The expression "in the vicinity of" means a distance from about 1 mm to about 500 mm. The injection of gas is introduced as an adjustable flow of gas which can easily be adjusted to the current deposition process and settings. The regulation of the flow of the injected flow of gas allows a dynamic adaptation of the separation factor.

Preferably, the gas of the atmosphere within the separation zone is aspired by means of pumping. This increases the separation factor.

The invention relates also to a modular coater for the deposit of thin layers under vacuum on a flat substrate having at least two depositing zones with a gas separation zone there between and having a conveying path for the glass substrate which passes through apertures from a depositing zone towards the other depositing zone via the separation zone, characterized in that the gas separation zone comprises at least one gas injector in the vicinity of the conveying path.

Preferably, the gas separation zone comprises further pumping means to aspire the gas out of the gas separation zone. This is a convenient means to increase the separation factor.

Preferably, covering means are disposed above the conveying path to define a tunnel together with the conveying path within the gas separation zone when a glass substrate is conveyed thereon and in that the at least one gas injector is arranged within said tunnel. This is convenient to obtain a good efficiency of the gas injection.

In the embodiment where the coater is a cathodic sputtering apparatus like a magnetron, the depositing zones are the sputtering zones having one or more cathode bays.

Preferably, the injector(s) is (are) arranged between the conveying path and a roof wall disposed at a distance between 5 and 50 mm of the conveying path to define a portion of tunnel with the substrate moving on the conveying path. Preferably, the gas injector(s) is (are) disposed between 10 mm and 100 mm, advantageously between 15 mm to 50 mm, for example at about 20 mm, of the conveying path. The gas is injected above the conveying path, but it can also be injected below the conveying path, in addition to be injected above.

The invention provides a dynamic way to modify the gas separation by injecting an adjustable flow of gas in the low conductance tunnel that separates the two depositing zones. The gas injected to improve the separation can preferably be pumped by ideally connecting the pumps on top of the tunnel; this limits the pressure increase in the depositing zone.

It is quite surprising that injecting gas in the gas separation zone, improve the separation factor. On the contrary, one could think that will disturb the deposit process in the depositing zones.

We have found that, surprisingly, the invention gives the possibility to reach higher separation factors, between 2 and up to 20 times better. This improvement can be further combined with a cost reduction due to two main factors: a reduced length of the gas separation zone and a reduced number of turbo-molecular pumps.

Another advantage of the invention is that this gas injection makes the separation factor easily adjustable and the accessible performance is that high that the dimensions can be noticeably reduced.

This increase of the separation factor gives a flexible way of tuning separation efficiency between depositing zones and is called dynamic separation tunnel.

Other advantages of the invention are that:
- the separation factor is significantly higher than on prior art design;
- the separation factor can be adjusted by modifying the quantity of injected gas;
- the separation factor range can vary from 1 to 10000;
- the space needed for separation equivalent to prior art design is shorter;
- the pressure in the depositing chamber can be controlled by the pumping capacity and can remain within acceptable values for sputtering process (0.1 to 99 mTorr, preferably 0.5 to 15 mTorr);
- two or more dynamics separation tunnels can be installed next to each other for special applications where very high separation factor is needed;
- two deposition zones separated by the gas separation zone according to the invention can operate at different pressure levels.

The convoying path could be a convoying on air cushion. Preferably, in practice, the conveying path is a roller conveyor. The use of a roller conveyor for conveying a succession of glass substrates prevents the use of a narrow aperture to enter and leaves the separation zone. In addition, the glass substrates may have different thicknesses between various series of production: that must also be taken into account for dimensioning the apertures.

Figure 2:
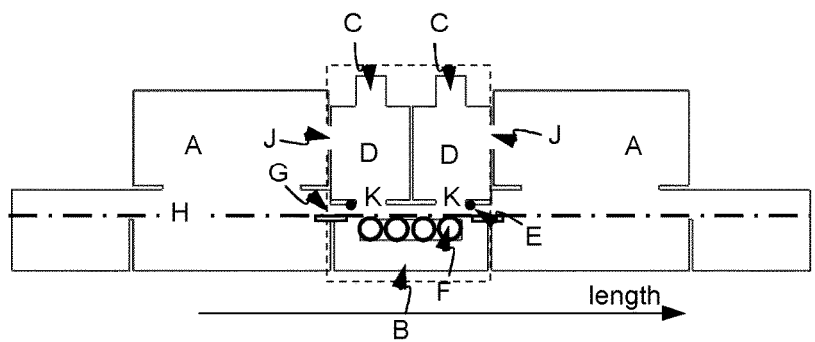

The following figures are given for illustration purpose only, but they may not limit the scope of the present invention:

FIG. 1 relates to a first embodiment of the invention showing two depositing zones with a separation zone there between;

FIG. 2 relates to a second embodiment of the invention showing two depositing zones with a separation zone there between.

FIGS. 1 and 2 show schematically a module comprising two chambers forming the first and second depositing zones (A) with a separation zone or chamber (B) there between. The optional pumping means of the deposition zones are not shown. The separation zone comprises two compartments (D) above the convoying path. Each compartment (D) comprises at least one pumping means (C) at the top, which can or cannot be activated, in order to maintain a low level of pressure inside the compartment and adjust the separation factor.

The convoying path (H) is materialized by the roller conveyor (F) inside the separation chamber. Between the first deposition zone (A) and the separation zone (B), there is an aperture (G) to leave the passage to the glass substrate.

Similarly, there is an aperture (G) between the separation zone (B) and the second deposition zone (A).

Each pumping compartments (D) is closed below by covering means in the form of a plate disposed at about 10 to 50 mm above the convoying path, so forming a tunnel path together with the substrate, when it is present, above the convoying path between the two depositing zones. In each plate there is a slit (K) which allows the pumping means to extract gas from the tunnel path.

A gas injector (E) is disposed near the entrance and the exit of the tunnel path and fixed at the plate covering the tunnel path. Each gas injector is a pipe drilled with holes so that the gas is injected in direction of the convoying path at about 20 mm above it.

In FIG. 2, there is also a side aperture (J) between each depositing zone (A) and pumping compartment (D) to allow gas to be extracted from the depositing zone through the pumping compartment.

The gas isolation factor or gas separation factor (SF) can be further increased by adjusting and/or combining different parameters. Among those, one can find gas separation zone dimensions such as the aperture (see reference G on FIG. 1) above the pass line (H), the length of the isolation tunnel (B), the width of the coater and the presence of pumps (C). Dimensions modification and addition of pumping capacity are common ways of doing separation, called static separation. A reduction of the separation chamber (zone) length by a factor of three can reduce the gas separation factor by approximately 50%. Dividing the pumping capacity by two can reduce the separation factor by 10% all the other parameters being constant.

In order to verify the effect of the invention in comparison to the prior art, we have conducted the following tests.

To demonstrate the impact of a simple injection without additional pumping in the separation zone we add neutral gas, like Argon, injection into the separation chamber. The experiment shows that an injected quantity of 2000 sccm (Standard Cubic Centimeters per Minute, i.e. a gas flow measurement) can multiplie the separation factors by approximately 2.5. An injected quantity of 10000 sccm can multiplie the separation factors by approximately 20. This shows the great flexibility on separation factor achievable with the invention.

These results can be improved by the addition of pumping capacity to the separation zone. If we consider a similar pumping capacity to what is found on existing design, the improvement on both gas flow injection plus pumping capacity in the separation zone represents a multiplicative factor of the separation factor of 3.75 up to 30.

A modification of the design of the pumping section in the separation zone, consisting in closing the side apertures on the topside of the pumping chamber (FIG. 2 J), can improve the value of the separation factor by 40%.

The invention open the possibility to reach separation factor values equivalent to standard separation factor value with a shorter tunnel length or to reach better separation factor values with standard separation zone length. The invention allows adjusting the separation factor what is impossible on existing design without venting the coater.

The level of the pressure inside the coater is advantageously controlled by the turbo-molecular pumps, ensuring a pressure level compatible with process. The value of the desired separation factor is modulated by variation of quantity of injected gas.

The gas is injected in the separation zone by means of injector(s) and the gas may come from the separation zone itself or from the neighbouring depositing zones.

The most suitable gas injection system is made from a pipe drilled with holes fixed along the chamber width (perpendicular to the transfer direction). Preferably, there is a gas injector close to each of the two depositing zone. The flow of the gas from the holes may be directed towards and perpendicularly to the convoying path or may be directed towards the apertures of the corresponding depositing zone.

In one embodiment, the injector(s) is (are) metal tube(s) of about 20 mm diameter with holes distributed over their length, the tube being disposed across the width of the convoying path at a distance of 20 mm of the convoying path.

Any other way of injecting gas in the separation zone is suitable for the current application whatever is the dimension or the geometry of the injection device. The injected flow is controlled by a regulator like a mass flow meter or any other device that can control the gas flow. The applicable range of flow is between 0 and 10000 sccm (standard cubic centimeter) obtained by controlling the flow or the pressure. The angle of ejection of the gas or the orientation of the holes in the pipe can vary according to geometrical constraints. If two or more injectors are used, the flow can be distributed uniformly or not between the different injector pipes. For example if two pipes are used as shown on FIG. 1, and that the total flow is 2000 sccm, the flow in one pipe can be 1000 and 1000 in the second one but it can also be 500 and 1500 sccm or any other distribution.

The principle of injecting gas to separate two depositing zones is valid for any type of gas but the expert knows that the selection of the gas will depend on the depositing process atmosphere to be separated.

The most suitable pumping means to combine with the gas injection according to the invention is based on four Turbo Molecular pumps having a nominal pumping capacity of 2300 l/s, fixed on the lid of the separation chamber. The process pressure range for which the invention takes the best advantage is preferably comprised between 0, 1 and 15 mTorr ideally. The number of pumps can vary between 0 and the maximal amount defined by the available space around the chamber. The pumping capacity of the TMP (Turbo Molecular Pump) must be designed to fit with the pressure range. The gas injection in a separation zone according to the invention while pumping to improve further the separation factor between two depositing zones is not limited to magnetron sputtering process pressure. Process running at higher pressure up to about 100 mTorr can be isolated one from each other by a dynamic tunnel equipped with rough vacuum pumps such as mechanical pumps or roots. In this case the flow of gas injected is much higher than described previously.

Other type of pumps such as diffusion pumps, mechanical pump or any type of pumps that would allow reaching the working pressure is suitable.

The most suitable geometry is based on separation zone (B) divided in two compartments (D). Each compartment is pumped by two pumps (C) placed on the lid of the separation zone. The bottom of the compartment is a plate with a slit (K) for pumping above the convoying path. The size of the slit (K) can vary between 0 (no pumping) and the total length of the compartment (fully open). The slit opening is not necessary located in the centre of the tunnel like on FIGS. 1 and 2. The injection of gas (E) is placed in the separation chamber above the conveyor (F) between the depositing chamber and the pumping slit (K). The length of the tunnel can vary between 100 and 2000 mm. The aperture (G) of the dynamic tunnel depends on the substrate thickness and can vary between 1 and 100 mm above the convoying path (H).

The apertures (G) may be different between the first depositing zone (A) and the second depositing zone (A). Ideally the compartments (D) have no direct opening (FIG. 2 J) to the depositing zone (A) but the performance of a pump section design on an existing coater could be improved by injecting gas in the tunnel and pumping it using the present configuration (opening on the side of the pump section FIG. 2 J). The width of the dynamic tunnel corresponds ideally to the width of the coater. The width depends on the application and the size of the substrates. The expert knows that homogenous pumping is reached if the slit is fully open in the width direction. However reducing the width of the slit (K) will only modify the pumping capacity.

EXAMPLE 1

This example shows the influence of the gas injection flow on the separation factor.

Starting from a prior art standard design based on static pumped isolation system we measured a gas separation factor (SF), according to the description here above. These values were compared to values obtained after modifications of the design according to the invention.

The reference design consisted in a separation tunnel of 1000 mm long without pumping between two depositing zones. A flow of 1000 sccm of Ar was injected in each depositing chambers adjacent to the separation tunnel. A flow of 40 sccm of $O_2$ was injected in only one depositing chamber and the partial pressure of $O_2$ was measured in the other depositing chamber. According to the invention, Ar gas was injected in two different flow values in the separation zone within the tunnel (see FIG. 1). The table 1 below summarizes the results measured for increasing flows of Ar injected in the separation tunnel. The SF is calculated relatively to the reference design without injection of gas (0 sccm of Ar).

TABLE 1

| Injected flow in the tunnel (sccm) | Relative Separation factor |
|---|---|
| 0 | 1 |
| 2000 | 3 |
| 10000 | 40 |

COMPARATIVE EXAMPLE 1

Comparative example 1 shows the influence of the pumping only (without gas injection) of the tunnel on the SF.

Here, the reference design consisted in a separation tunnel of 300 mm long without pumping compared to a total pumping capacity of 9000 and 18000 l/s. A flow of 1000 sccm of Ar was injected in each depositing chambers adjacent to the tunnel. A flow of 40 sccm of $O_2$ was injected in one depositing chamber and the partial pressure of $O_2$ was measured in the other depositing chamber. The table 2 below summarizes the results measured for increasing pumping capacity in the dynamic tunnel. The SF was calculated relatively to the reference design (no pumping).

TABLE 2

| Pumping capacity (l/s) | Relative Separation factor |
|---|---|
| 0 | 1 |
| 9000 | 1.6 |
| 18000 | 1.8 |

EXAMPLE 2

Example 2 shows a comparison of a prior art standard coater of the Von Ardenne type design with a dynamic separation tunnel design according to the invention.

The Von Ardenne type prior art coater design is described here above. The length of the separation tunnel is 780 mm. There are four pumps with a capacity of 2300 l/s each. The table 3 below gives the experimental absolute separation factor in both cases.

TABLE 3

| Design | Separation factor. |
|---|---|
| Prior art (Von Ardenne type) | 175 |
| Dynamic tunnel for 2000 sccm Ar injected | 625 |

The invention may be implemented on all existing magnetron coaters. The invention may also be used for any process (PECVD) that needs to be separated efficiently whatever is the pressure of the process (from about 0.1 mTorr to 100 mTorr). The main advantage is that the invention allows good separation factor on small space. Thus it is a compact system that can be used on compact coater design to limit the cost of investment but also to combine different processes like magnetron coating in one depositing chamber and PECVD (Plasma-Enhanced Chemical Vapour Deposition) in the other one next to it.

The invention claimed is:

1. A process for depositing a multi-layer coating stack on a flat glass substrate, the process comprising:
    depositing by sputtering under vacuum at a pressure comprised between 0.5 and 15 mTorr a first layer in a first depositing zone having a first atmosphere and a second layer in a second depositing zone having a second atmosphere which is separated from the first atmosphere by a separation zone that contains a tunnel comprising an uninterrupted convoying path, and
    injecting gas into the separation zone from a gas injector located inside the separation zone,
    wherein the gas injector is a first gas injector located between the first depositing zone and a first pumping slit in the separation zone.

2. The process of claim 1, wherein the injecting is performed through a pipe drilled with holes, and further comprising pumping the gas out of the separation zone.

3. The process of claim 1, wherein the first and second atmospheres are different.

4. The process of claim 1, wherein the gas is injected close to apertures between the separation zone and each of the two depositing zones.

5. The process of claim 1, wherein the gas is injected towards or perpendicularly to the tunnel containing the convoying path.

6. The process of claim 1, wherein the convoying path for the flat glass substrate passes through apertures from the first depositing zone via the separation zone towards the second depositing zone and the gas is injected through injectors closest to each depositing zone and directed towards the apertures of depositing zones closest to each injector.

7. The process of claim 1, wherein the gas is injected within 10 mm and 100 mm of the convoying path.

8. The process of claim 1, wherein the multi-layer coating stack is deposited on the flat glass substrate in an uninterrupted way.

9. The process of claim 1, wherein the tunnel has a length of between 100 and 2000 mm.

10. The process of claim 1, further comprising injecting gas into the separation zone from a second gas injector located between a second pumping slit and the second depositing zone.

11. The process of claim 1, wherein the separation zone comprises a plate disposed between 10 and 50 mm above the convoying path, the plate having an opening.

12. A process for depositing multiple layers on a flat glass substrate comprising:
   depositing under vacuum a first layer on a flat glass substrate in a first depositing zone having a first atmosphere,
   conveying the glass substrate comprising the first layer into a separation zone comprising a tunnel containing a convoying path into which a gas is injected from an injector located inside the tunnel,
   removing gas out of the separation zone through two compartments with no apertures between them where each compartment is open to the tunnel path,
   conveying the glass substrate comprising the first layer through the separation zone into a second depositing zone having a second atmosphere, and
   depositing under vacuum a second layer on said flat glass substrate comprising the first layer.

13. The process of claim 12, wherein the two compartments are equipped with pumps and gas is removed from the separation zone by pumping the gas through the two compartments.

14. The process of claim 12, wherein the gas injected into the separation zone is injected perpendicularly to the convoying path of the glass substrate.

15. The process of claim 12, wherein the gas injected into the separation zone is injected inwardly toward apertures between the first depositing zone and the separation zone and between the separation zone and the second depositing zone.

16. The process of claim 12, wherein the two compartments are each equipped with at least one pump and a bottom plate containing a slit arranged above the tunnel comprising the convoying path of the glass substrate;
   wherein said compartments are adjacent to one another and have no direct openings with each other or to either the first or second depositing zones, and
   wherein gas is injected at each end of the tunnel and removed through the two adjacent compartments in the separation zone.

17. The process of claim 16, wherein the process is performed on apparatus where a separation factor between the first and second depositing zones ranges from 2- to 20-times more than that in an otherwise identical apparatus where gas is not injected into the separation zone.

18. The process of claim 12, wherein the tunnel has a length of between 100 and 2000 mm.

19. A process for depositing multiple sputtered layers on a flat glass substrate comprising:
   depositing a first layer on a flat glass substrate by sputtering at a pressure comprised between 0.5 and 15 mTorr in a first depositing zone having a first atmosphere,
   transporting the flat glass substrate having the first deposited layer through a tunnel path in a separation zone into a second depositing zone having a second atmosphere,
   in the second depositing zone, depositing a second layer on the flat glass substrate having the first deposited layer, and
   injecting gas into the separation zone from an injector located inside the separation zone,
   wherein the separation zone comprises (i) the tunnel path and (ii) two compartments with no apertures between them that are equipped with pumps and that the compartments are adjacent and open to the tunnel path, and wherein gas injected into ends of the tunnel path flows into the tunnel path and then flows or is pumped into the two compartments thus separating the atmospheres of the first and second depositing zones.

* * * * *